United States Patent
Yamada et al.

(10) Patent No.: US 9,713,900 B2
(45) Date of Patent: Jul. 25, 2017

(54) RESIN MOLD FOR NANOIMPRINTING AND PRODUCTION METHOD THEREOF

(75) Inventors: Hiroko Yamada, Sayama (JP); Takahide Mizawa, Sayama (JP)

(73) Assignee: Soken Chemical & Engineering Co., Ltd., Tokyo (JP)

( * ) Notice: Subject to any disclaimer, the term of this patent is extended or adjusted under 35 U.S.C. 154(b) by 600 days.

(21) Appl. No.: 13/814,325

(22) PCT Filed: Aug. 3, 2011

(86) PCT No.: PCT/JP2011/067775
§ 371 (c)(1),
(2), (4) Date: Feb. 5, 2013

(87) PCT Pub. No.: WO2012/018048
PCT Pub. Date: Feb. 9, 2012

(65) Prior Publication Data
US 2013/0127090 A1 May 23, 2013

(30) Foreign Application Priority Data

Aug. 6, 2010 (JP) .................................. 2010-177602

(51) Int. Cl.
*B29C 59/00* (2006.01)
*B29C 59/02* (2006.01)
(Continued)

(52) U.S. Cl.
CPC ............ *B29C 59/005* (2013.01); *B29C 33/40* (2013.01); *B29C 33/56* (2013.01); *B82Y 10/00* (2013.01);
(Continued)

(58) Field of Classification Search
CPC ......... B29C 59/00; B29C 33/40; B29C 33/56; B29C 2059/023; B29C 33/424;
(Continued)

(56) References Cited

U.S. PATENT DOCUMENTS 7,819,652 B2   10/2010   Lee et al.
8,012,667 B2    9/2011   Nam et al.
(Continued)

FOREIGN PATENT DOCUMENTS

JP    2003306520 A    10/2003
JP    2007335873 A    12/2007
(Continued)

OTHER PUBLICATIONS

Choi, P. et al., "Siloxane Copolymers for Nonimprint Lithography", Advanced Functional Materials, Wiley—VCH Verlag GmbH & Co. KGAA, DE, vol. 17, No. 1, Jan. 5, 2007, pp. 65-70.
(Continued)

*Primary Examiner* — Alison L Hindenlang
*Assistant Examiner* — Jerzi H Moreno Hernandez
(74) *Attorney, Agent, or Firm* — The Webb Law Firm

(57) ABSTRACT

A resin mold for nanoimprinting has a substrate, a resin layer formed upon the substrate and having a depressions and protrusions pattern on a surface, an inorganic substance layer formed of uniform thickness on at least the surface having the depressions and protrusions pattern of the resin layer, and a mold release agent layer formed of uniform thickness on at least the surface having the depressions and protrusions pattern of the inorganic substance layer. The resin of the resin layer includes constituent units derived from an epoxy group-containing unsaturated compound at a concentration of 1 to 50 percent relative to total constituent units, and the epoxy value is $7.0 \times 10^{-4}$ to $4.0 \times 10^{-2}$.

11 Claims, 4 Drawing Sheets

(51) Int. Cl.
    *B29C 33/40* (2006.01)
    *B29C 33/56* (2006.01)
    *B82Y 10/00* (2011.01)
    *B82Y 40/00* (2011.01)
    *G03F 7/00* (2006.01)
    *B29C 33/42* (2006.01)

(52) U.S. Cl.
    CPC ............ *B82Y 40/00* (2013.01); *G03F 7/0002* (2013.01); *B29C 33/424* (2013.01); *B29C 2033/426* (2013.01); *B29C 2059/023* (2013.01)

(58) Field of Classification Search
    CPC ... B29C 2033/426; B82Y 40/00; B82Y 10/00; B82Y 30/00; Y10T 428/1005; G03F 7/00
    See application file for complete search history.

(56) References Cited

U.S. PATENT DOCUMENTS

| | | | | |
|---|---|---|---|---|
| 8,329,089 | B2 * | 12/2012 | Kim et al. ................... | 264/496 |
| 2007/0284777 | A1 | 12/2007 | Kim et al. | |
| 2009/0046362 | A1 * | 2/2009 | Guo ....................... | B82Y 40/00 |
| | | | | 359/485.05 |
| 2010/0160478 | A1 * | 6/2010 | Nilsson et al. ............... | 522/170 |
| 2010/0258978 | A1 * | 10/2010 | Yamada .................. | B29C 59/04 |
| | | | | 264/293 |
| 2010/0304087 | A1 | 12/2010 | Kusuura et al. | |
| 2011/0084424 | A1 | 4/2011 | Kaida et al. | |
| 2011/0144279 | A1 * | 6/2011 | Uchida ..................... | C08F 8/14 |
| | | | | 525/301 |
| 2012/0133077 | A1 | 5/2012 | Mizawa et al. | |
| 2012/0247950 | A1 | 10/2012 | Kaida et al. | |

FOREIGN PATENT DOCUMENTS

| | | | |
|---|---|---|---|
| JP | 2008006820 A | | 1/2008 |
| JP | 2008068612 A | | 3/2008 |
| JP | 2008168480 A | | 7/2008 |
| JP | 2008282467 A | | 11/2008 |
| JP | 2009184117 A | | 8/2009 |
| JP | 2010113772 A | | 5/2010 |
| JP | 2011025677 A | * | 2/2011 |
| KR | 10-2010-0031522 A | | 3/2010 |
| WO | 2008/124180 A1 | | 10/2008 |
| WO | 2009148138 A1 | | 12/2009 |
| WO | 2011016549 A1 | | 2/2011 |

OTHER PUBLICATIONS

Pina-Hernandez Carlos et al., "Easy Duplication of Stamps Using UV-cured fluoro-silsesquioxane for nanoimprint lithography", Journal of Vacuum Science and Technology: Part B, AVS/AIP, Melville, New York, NY, vol. 2, No. 6, Dec. 1, 2008, pp. 2426-2429.

* cited by examiner (a)

(b)

(c)

(d)

(e)

(a)

(b)

RESIN MOLD FOR NANOIMPRINTING AND PRODUCTION METHOD THEREOF

TECHNICAL FIELD

The present invention relates to a resin mold for nanoimprinting and a production method thereof. In particular, the present invention relates to a resin mold for nanoimprinting and a production method thereof in which the resin mold has an inorganic substance layer between a mold release agent layer and a resin layer.

BACKGROUND ART

Imprinting technology is a technology in which a mold for molding a pattern is pressed into a liquid resin or the like upon a substrate, and transfers the pattern of the mold to the resin. Depressions and protrusions patterns exist at sizes ranging from nano-scale (10 nm level) to about 100 μm, and these patterns are used in various types of fields such as semiconductor materials, optical materials, recording media, micro machines, biotechnology, environment, or the like.

Types of imprinting are exemplified by thermal imprinting, photo imprinting, or the like. Thermal imprinting presses a mold having a certain geometry formed in the surface thereof against a thermoplastic resin melted at a temperature greater than or equal to the glass transition temperature, thermally imprints the surface geometry of the mold into the thermoplastic resin, and peels off the imprinted thermoplastic resin from the mold after cooling. Photo imprinting presses the same type of mold against a photo-curable resin, causes curing of the photo-curable resin by ultraviolet radiation, and then peels the cured photo-curable resin from the mold.

On the other hand, in consideration of the need for the mold to have strength, toughness, processability, and dimensional stability, materials such as quartz, silicon, or the like have been conventionally used for the mold. However, such materials have problems such as easy breakage, high cost, time required for production, or the like. In order to solve such problems, mass production is being attempted by using such a quartz or the like mold as a master mold, obtaining a resin mother pattern, and further producing a replica mold based on the mother pattern. Due to general utility and cost, resin replica molds are used as replica molds.

A photo-curable acrylic resin copolymer of methyl methacrylate, at least one type of (meth)acrylate ester where the alcohol residue is a 2 to 10 carbon number alkyl, and a glycidyl group-containing (meth)acrylate is known as a resin for undergoing imprinting (for example, see Patent Document 1).

Moreover, active energy beam curable resin formed of (meth)acrylic acid and an glycidyl group-containing epoxy compound is known to have excellent strength, adhesion, and cracking resistance (for example, see Patent Document 2).

These resins are cured compositions that include a compound including a glycidyl group as a monomer by using active energy beam (e.g. ultraviolet radiation or the like). During the reaction, a carboxylic acid group, hydroxyl group, or the like reacts with the glycidyl group, and the ring opening of the epoxy group causes the epoxy resin to cure.

On the other hand, when a resin replica mold is obtained from the master mold, and when glycidyl groups exist in the resin forming the replica mold (resin mold), compatibility between the surface of the master mold and the surface of the replica mold becomes high, the replica mold becomes difficult to peel from the master pattern, and sometimes the form of the formed replica mold is disrupted during demolding.

Moreover, various types of optical devices are formed by placing and pressing a resin film against the surface of this replica mold, so as to transfer the depressions and protrusions geometries formed in the surface of the replica mold to the resin surface. However, during such molding, attachment of the resin film to the replica mold often occurs and makes it difficult to peel the resin film from the replica mold.

To avoid the above problem, a mold release agent layer is formed on the surface of the replica mold. However, simultaneous with the mold release agent layer becoming a mold release agent layer for the resin film, the mold release agent layer also becomes a mold release agent layer for the replica mold formed from resin. Thus, when the depressions and protrusions formed in the replica mold are transferred to the resin film, the mold release agent layer peels from the surface of the replica mold and sometimes transfers and attaches to the surface of the resin film onto which the depressions and protrusions were formed.

In order to prevent such transfer and attachment of the mold release agent layer, an oxide layer formed of an inorganic oxide is formed on the surface of the replica mold, and the shedding of the mold release agent layer from the surface of the replica mold is prevented. Although it is possible to prevent shedding of the mold release agent layer from the oxide layer by formation of a mold release agent layer with this oxide layer interposed between the mold release oxide layer and the mold, adhesion of this oxide film to the resin film is not necessarily good.

Therefore, there is a problem in that, even when the mold release agent layer and the oxide film are integrated, there still may be transfer of the integrated mold release agent layer and oxide film to the surface of the imprinted resin film.

CITATION LIST

Patent Literatures

Patent Document 1: Japanese Unexamined Patent Application Publication No. 2008-282467
Patent Document 2: Japanese Unexamined Patent Application Publication No. 2003-306520

An object of the present invention is to provide a resin mold for imprinting without transfer defects, that has excellent mold releasability from the resin to be imprinted, and that does not cause imprinting defects. Moreover, another object of the present invention is to provide a resin mold such that peeling does not occur between various layers and the substrate during imprinting. Yet another object of the present invention is to provide a resin mold for nanoimprinting that has flexibility and can be used by fixing to a roller or the like.

SUMMARY OF THE INVENTION

The resin mold for imprinting of the present invention is a resin mold having depressions and protrusions transferred from a surface of a master mold are formed on the surface; the mold resin comprises a main chain formed by (co)polymerization of a monomer having an ethylenic double bond; at least a part of the main chain is formed with a reactive monomer having an epoxy group; and the main chain is formed by causing reaction of the ethylenic double bond without ring opening of the epoxy group of the reactive monomer.

In this manner, due to polymerization through the ethylenic double bond without ring opening of the epoxy group, it is possible to form a robust resin mold, and non-ring opened epoxy groups exist at the resin mold surface. These epoxy groups extend as side chain from the resin forming the resin mold to the inorganic substance layer formed on this surface and strongly bind the resin mold and the inorganic substance layer together. Thus, due to the existence of epoxy groups, the inorganic substance layer and the surface of the resin composing the mold are strongly bound together in this manner. Therefore, it is possible to use the resin mold for nanoimprinting formed of the resin of the present invention, the mold release agent layer, and the inorganic substance layer for a longtime interval, with little transfer of the mold release agent layer and the inorganic substance layer to the transfer object during imprinting.

Furthermore, the oxide layer is strongly bonded to the resin surface. Thus the geometry of the resin mold for nanoimprinting of the present invention is resistant to distortion.

The resin mold for nanoimprinting of the invention of the present application is capable of imprinting without transfer defects. Moreover, by arrangement of an inorganic substance layer between the resin layer and the mold release agent layer, adhesion between each of the layers of the resin mold for nanoimprinting becomes good. Thus after imprinting, there is excellent mold releasability to separate the imprinted resin and the resin mold for nanoimprinting, and there is no occurrence of lack of the mold release agent layer of the mold. Furthermore, it is possible to control thickness of the mold release agent layer, and thus the mold release agent layer does not affect precision of the edges.

Adhesion between the resin layer and substrate and adhesion between the resin layer and mold release agent layer are good for the resin mold for nanoimprinting of the invention of the present application due to the specific composition of the resin layer. As a result, the resin mold for nanoimprinting of the invention of the present application is readily used for imprinting multiple times without peeling of the resin layer from the substrate and/or mold release agent layer. Moreover, defects such as cracks or the like in the resin layer due to the imprinting do not occur.

The resin mold for nanoimprinting of the invention of the present application can be inexpensively mass produced since resin is used for the main body.

Furthermore, thickness of the inorganic substance layer of the resin mold for nanoimprinting of the invention of the present application is less than or equal to a fixed value. Depending on composition of the mold, it is thus possible for the resin mold for nanoimprinting to have flexibility, and it is possible to use the resin mold for nanoimprinting for imprinting in various forms, such as roller imprinting or the like.

DETAILED DESCRIPTION OF THE INVENTION

1. Resin Mold for Nanoimprinting

The resin mold for nanoimprinting of the present invention will be described below while referring to figures.

The resin mold for nanoimprinting of the present invention is a resin mold for nanoimprinting that has a multi-layered structure of laminated multiple layers of different materials.

Figure 1:
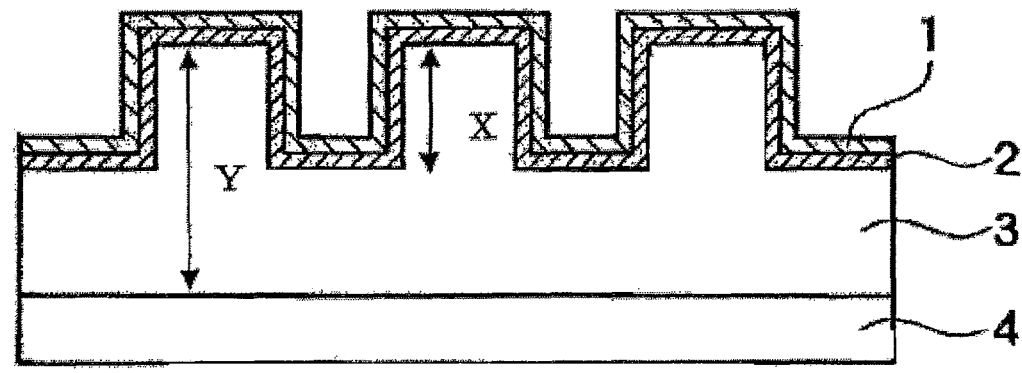
FIG. 1 shows the resin mold for nanoimprinting of the present invention.

That is to say, as shown in FIG. 1, the resin mold for nanoimprinting of the present invention has a four-layer structure that has: a substrate 4, a resin layer 3 formed on the aforementioned substrate and having a surface depressions and protrusions pattern, and inorganic substance layer 2 formed with uniform thickness on at least the surface having the depressions and protrusions pattern of the aforementioned resin layer 3, and a mold release agent layer 1 formed with uniform thickness on at least the surface having the depressions and protrusions pattern of the aforementioned inorganic substance layer 2.

The resin mold for nanoimprinting of the present invention is basically a resin mold having depressions and protrusions transferred from a surface of a master mold and is formed of a resin; wherein, the resin includes a main chain formed by (co)polymerization of a monomer having an ethylenic double bond; at least a part of monomers forming the main chain is a reactive monomer having an epoxy group; and the main chain is formed by causing reaction of the ethylenic double bond without ring opening of the epoxy group.

Examples of the type of substrate composing the resin mold for nanoimprinting of the present invention are preferably resins, glasses, silicon, sapphire, gallium nitride, carbon, and silicon carbide.

The resin used for the aforementioned substrate is exemplified by polyethylene terephthalates, polycarbonates, polymethylmethacrylates, polystyrenes, cyclic polyolefins, polyimides, polysulfones, polyether sulfones, and polyethylene naphthalates.

The resin used for the aforementioned substrate may be in the form of a plate-like or in the form of a film-like. Plate-like forms are exemplified by a polymethylmethacrylate plate, polycarbonate plate, polycycloolefin plate, or the like. Film-like forms are exemplified by polyethylene terephthalate film, polycarbonate film, polyester film, polyolefin film, polyimide film, poly sulfone film, polyether sulfone film, and polyethylene naphthalate film, or the like.

When the resin mold for nanoimprinting of the present invention has the aforementioned type of substrate, and when the substrate is plate-like, normally, thickness of the plate-like substrate is in the range of 0.1 to 100 mm. By using a plate-like substrate of this thickness, although flexibility of the obtained resin mold for nanoimprinting declines somewhat, the resin mold for nanoimprinting itself becomes resistant to the occurrence of loss of shape. Moreover, when a film-like substrate is used, the thickness of the film-like substrate is normally in the range of 30 to 300 µm. Due to use of this film-like substrate, the resin mold for nanoimprinting has suitable flexibility, and this type of film-like substrate may be used, for example, by wrapping the mold around a roll.

The resin mold for nanoimprinting of the present invention has a resin layer on the surface of the aforementioned substrate.

This resin layer is a copolymer of a monomer having an ethylenic double bond composing the main chain of the resin, and having a monomer (epoxy group-containing monomer) having an epoxy group as well as an ethylenic double bond.

Taking the total of component units forming the resin layer to be 100 percent by weight, the resin forming the aforementioned resin layer normally includes from 1 to 50 percent by weight, and preferably includes from 20 to 40 percent by weight, of the constituent unit derived from the epoxy group-containing unsaturated monomer. When the resin is formed using this amount of the epoxy group-containing unsaturated compound, the epoxy value of the resin is normally within the range of $7.0 \times 10^{-4}$ to $4.0 \times 10^{-2}$, and preferably is within the range of $1.4 \times 10^{-2}$ to $2.8 \times 10^{-2}$.

In the above described manner, the resin forming the resin mold for nanoimprinting of the present invention has an epoxy value, and ring opening of the epoxy groups during copolymerization of the resin must not be allowed.

That is to say, when using the conventional resin mold for nanoimprinting, compatibility between the resin layer and the mold release agent layer was low, resulting in shedding of the mold release agent layer over a short time interval. The shot count of uses of this resin mold for nanoimprinting was low, and there was a need for frequent replacement of the resin mold for nanoimprinting. An inorganic substance layer had been formed between the mold release agent layer and the resin layer to solve this type of difficulty. By interposing this inorganic substance layer, although compatibility between the mold release agent layer and the inorganic substance layer was improved, and compatibility between the mold release agent and the resin layer was improved, compatibility between the resin layer and the conventional inorganic substance layer was not necessarily sufficient. However, due to use of a resin layer that includes constituent units derived from the epoxy group-containing unsaturated monomer, a resin mold having high durability to repeated use and high compatibility between the resin layer and the inorganic substance layer is obtained.

The resin forming the resin layer is exemplified by monomers forming thermoplastic resins, thermosetting resins, or photo-curable resins. Preferred examples of resins forming this type of resin layer are acrylic type resins, styrene type resins, olefin type resins, and acrylic urethane type resins. More preferred examples of such resins are polymethylmethacrylate, cycloolefin resins, and styrene resins. The monomers forming this type of resin are monomers that do not include a group that is reactive toward the epoxy group-containing monomers.

Examples of (meth)acrylate type monomers used for the present invention include alkyl (meth)acrylates such as methyl (meth)acrylate, ethyl (meth)acrylate, n-propyl (meth)acrylate, n-butyl (meth)acrylate, isobutyl (meth)acrylate, t-butyl (meth)acrylate, 2-ethylhexyl (meth)acrylate, lauryl (meth)acrylate, stearyl (meth)acrylate, isobornyl (meth)acrylate, or the like.

Moreover, examples of styrene type monomers include styrene, α-alkyl styrene, or the like.

Examples of olefin type monomers include linear olefins having 2 to 20 carbon atoms such as ethylene, propylene, hexene, or the like; and cyclic olefins.

By reaction between this type of monomer and the ethylenic double bond of the epoxy group-containing monomer, the main chain of the resin forming the resin layer of the present invention is formed while leaving the rings of the epoxy groups unopened.

That is to say, the resin layer of the present invention is a copolymer of an epoxy group-containing monomer and a monomer for forming the resin as described above. This epoxy group-containing monomer has an epoxy group and also has an ethylene group capable of copolymerization with the monomer composing the aforementioned resin.

Examples of such epoxy group-containing monomers include glycidyl methacrylate, 4-hydroxybutyl glycidyl ether, or the like.

The above described type of epoxy group-free monomer and the epoxy group-containing monomer are reacted at a weight ratio that is normally from 99:1 to 40:60, and preferably is from 80:20 to 60:40.

These monomers may be reacted by polymerization methods such as photopolymerization, thermal polymerization, or the like. By substantially avoiding the use of catalysts and groups reactive with the epoxy ring, it is possible to form the main chain of the resin by selective reaction of the ethylenic double bond without allowing ring opening of the epoxy group via various polymerization methods. Since any ring opening reactions of the epoxy group hardly progress, the epoxy value of the resin obtained in this manner may be readily calculated based on the utilized amounts of monomers.

That is to say, the epoxy group is present as a side chain of the main chain structure of the resin forming the resin layer, and the epoxy group is not included in the main chain structure of the resin.

During this photopolymerization, a catalyst may be used for causing the reaction between the ethylenic double bonds by normal photopolymerization. Moreover, the photopolymerization reaction may be performed in the presence or absence of a reaction solvent. The irradiation light energy is normally from 5 to 100 mW/cm$^2$, and preferably is from 10 to 80 mW/cm$^2$.

In the aforementioned type of resin layer of the resin mold for nanoimprinting of the present invention, there is a main chain structure formed by mutual bonding of ethylenic double bonds, and, in the part using the epoxy group-containing monomer, the epoxy group that has not been subjected to ring opening is present as side chains. The epoxy value of the resin forming the resin layer at this time is the value corresponding to the amount of the epoxy group-containing monomer used as described above.

By arranging the inorganic substance layer between the mold release agent layer and the resin layer that has the unopened epoxy groups, shedding of the inorganic substance layer from the resin layer does not easily occur due to high compatibility between this epoxy group and the inorganic substance layer. Furthermore, due to substantially high compatibility between the inorganic substance layer and the mold release agent layer, inter-layer separation between the inorganic substance layer and the mold release agent layer also does not easily occur.

Thus, even after repeated imprinting, the resin mold for nanoimprinting of the present invention is resistant to shedding of the mold release agent layer, or the mold release agent layer and the inorganic substance layer from the resin layer. A single resin mold for nanoimprinting may be repeatedly used for a imprinting count (transfer count). Although it is extremely unusual to exceed a transfer count of 20 when using a single conventional resin mold for nanoimprinting, by use of the resin mold for nanoimprinting of the present invention, there is almost no problem for the resin mold for nanoimprinting even when 20 transfers have been made, i.e. there is hardly any occurrence of decreased water contact angle, incomplete transfer pattern, or the like.

Moreover, the resin mold for nanoimprinting of the present invention is formed from the resin layer as described above, and thus has the advantage of being resistant to the occurrence of cracking in the resin layer and also in the inorganic substance layer.

Thickness of the resin layer having the aforementioned structure is normally from 15 nm to 50 μm, and preferably is from 100 nm to 5 μm. When thickness of the resin layer is in the aforementioned range, the resin layer has strength for withstanding stamping, has good smoothness, and is readily handled.

Here, "thickness of the resin layer" means the distance between the bottom face of the resin layer and the highest face of the depressions and protrusions of the surface.

The aforementioned resin layer has a desired depressions and protrusions geometry on the surface of the resin layer.

The "desired geometry" is normally a depressions and protrusions pattern that has a fixed repeat frequency. That is to say, this is a depressions and protrusions pattern that preferably has a frequency of 10 nm to 50 μm, a depth of 10 nm to 50 μm, and a transferring surface of 1.0 to $1.0 \times 10^6$ mm².

Specific examples of depressions and protrusions geometries include moth-eye, linear, columnar, monolithic, conical, multi-sided pyramidal, and micro-lens shaped.

The inorganic substance layer is formed on the surface of the resin layer where the depressions and protrusions pattern is formed in the aforementioned manner.

The inorganic substance layer of the present invention is formed from an inorganic substance or inorganic oxide, and preferably is formed from an inorganic oxide. More preferred examples of the inorganic oxide include $SiO_2$, $ZrO_2$, $ZnO$, $Ta_2O_5$, $HfO_2$, ITO, FTO, and $TiO_2$. Even more preferred examples include $SiO_2$, $ZrO_2$, $Ta_2O_5$, $HfO_2$, ITO, and $TiO_2$. The inorganic substance is more preferably $SiO_2$ or $TiO_2$. These oxides may be used as one type or as a combination of multiple types.

The aforementioned inorganic substance layer may be formed by various types of methods. A preferred method uses a target of the metal corresponding to the aforementioned inorganic substance, and causes vapor phase deposition by vacuum deposition, CVD, sputtering, or the like. Oxidation occurs during vapor deposition in this manner, and in most cases, an oxide, carbide, or nitride is deposited on the surface of the resin layer.

Furthermore, the inorganic substance is preferably deposited onto the resin layer, onto which the aforementioned inorganic substance layer is formed for attachment, while the resin layer is rotated or revolved. Moreover, the inorganic substance is preferably deposited under rotation and revolution in opposite directions, each for a fixed time interval. By deposition of the oxide in this manner under rotation or revolution, it is possible to form an inorganic substance layer that has higher uniformity.

Then, the inorganic substance layer formed in this manner thoroughly penetrates into the resin molecules of the surface of the resin layer without a gap, becomes indistinguishably intermixed with the non-ring-opened epoxy groups present as side chains of the resin forming the resin layer, and greatly improves compatibility with the resin layer and the inorganic substance layer.

Thickness of the inorganic substance layer formed in the aforementioned manner is normally from 0.5 to 100 nm, preferably is from 0.5 to 20 nm, and more preferably is from 1 to 10 nm. When thickness of the inorganic substance layer is less than the aforementioned lower limit, the inorganic substance layer sometimes does not function, i.e. does not improve compatibility between the mold release agent layer and the resin layer. Furthermore, sometimes the function of maintaining surface form of the resin layer is not realized. Moreover, when thickness exceeds the aforementioned upper limit, the depressions and protrusions geometry formed in the surface of the resin layer sometimes is buried by the inorganic substance layer, and there are further instances in which cracking occurs in the inorganic substance layer.

The aforementioned inorganic substance layer formed on the resin mold for nanoimprinting of the present invention is formed of uniform thickness on at least the surface having the depressions and protrusions pattern of the resin layer. The expression "uniform thickness" means substantially uniform thickness, and means a thickness that is uniform within a standard deviation of 0.1 to 15. Therefore the surface of the inorganic substance layer maintains the surface geometry of the resin layer.

The mold release agent layer is formed on the surface of the inorganic substance layer formed in the aforementioned manner.

The "mold release agent" is a component that lowers the surface energy of the demolding surface and aids in demolding.

The mold release agent layer is composed of mold release agent, preferably fluorine type silane coupling agents, perfluoro compounds having an amino group or carboxyl group, and perfluoroether compounds having an amino group or carboxyl group. More preferably, the mold release agent layer is composed of at least one type selected from among a group that includes fluorine type silane coupling agents. At least part of the mold release agent layer formed in this manner bonds and couples with the inorganic substance layer therebelow and causes an expression of high compatibility between the inorganic substance layer and the mold release agent layer.

Thickness of this type of mold release agent layer is normally from 0.5 to 20 nm, preferably is from 0.5 to 15 nm, and more preferably is from 0.5 to 10 nm.

The aforementioned mold release agent layer is formed of uniform thickness on at least the surface having the depressions and protrusions pattern of the inorganic substance layer. The expression "uniform thickness" means substantially uniform thickness, and means a thickness that is uniform within a standard deviation of 0.1 to 10. Therefore the surface of the mold release agent layer maintains the surface geometry of the resin layer.

The mold release agent layer that has this type of structure has a pure water contact angle of the mold release agent layer surface that is normally greater than or equal to 100 degrees, preferably is from 100 to 130 degrees, and more preferably is from 100 to 120 degrees, i.e. surface tension is extremely small. That is to say, when the contact angle is within the aforementioned range, ease of wetting by liquid is low. Thus when the liquid resin for imprinting is coated onto the surface of the mold release agent layer, it is possible to suppress movement of the resin of the mold release agent layer surface, and demolding of the imprinted resin from the mold release agent layer surface becomes easy. Furthermore, even when imprinting is repeatedly performed, the degree of change of the pure water contact angle is small, and this resin mold may be used for a long time interval.

A depressions and protrusions pattern repeated at a fixed frequency is formed on the surface of the resin mold for nanoimprinting of the present invention having the layered structure as described above.

This pattern is preferably formed at a frequency of 10 nm to 50 μm.

Moreover, a surface pattern geometry period of 20 nm to 500 nm is preferred for use in semiconductor materials, media, optical elements, or the like. A surface pattern geometry period of 200 nm to 20 μm is suitable for optical material applications such as prisms, micro lenses, or the like.

Moreover, a depth of the aforementioned pattern is preferably from 50 nm to 1 μm, and more preferably from 100 to 600 nm.

That is to say, as shown in FIG. 1, thickness of the resin layer is taken to Y, and depth of the pattern is taken to be X. Then the relationship between thickness of the resin layer and pattern depth is normally in the range of Y=X to Y=15X, preferably is in the range of Y=2X to Y=12X, and more preferably is in the range of Y=3X to Y=10X. When thermal imprinting or the like is performed during production of the resin mold when the resin film thickness is less than 1 times the pattern height, the pattern height of the master mold is not reflected. Moreover, in the case this ratio is greater than or equal to 15-fold, the resin of the transfer part runs out due to pressing (normally at 20 MPa) during thermal imprinting when the resin mold for nanoimprinting is produced, numerous protuberances are formed by the excess resin at the flank of the master mold, and it becomes difficult to form a resin mold that has a uniform transferring surface.

Furthermore, although no particular limitation is placed on the surface area of the transferring surface, this is normally from about 1.0 to $1.0 \times 10^6$ mm$^2$ for imprinting work.

Although no particular limitation is placed on the geometry of the depressions and protrusions, specific examples of the form include moth-eye-like, linear, columnar, monolithic, conical, poly-sided pyramidal, micro lens-like, or the like.

2. Method of Production of the Resin Mold for Nanoimprinting

The resin mold for nanoimprinting of the present invention may be produced by a process having the following steps:

(I) a step of applying an active energy beam-curable composition including 1 to 50 parts by weight of an epoxy group-containing unsaturated compound (based on 100 parts by weight of the total composition) onto a substrate;

(II) a step of contacting the aforementioned active energy beam-curable composition against a mold, irradiating active energy beam, transferring a depressions and protrusions pattern formed in the surface of the aforementioned mold, and forming a resin layer having less than or equal to 15 percent change of epoxy value relative to epoxy value of the aforementioned active energy beam-curable composition;

(III) a step of forming an inorganic substance layer of uniform thickness on at least a surface having a depressions and protrusions pattern of the aforementioned resin layer; and (IV) a step of forming a mold release agent layer of uniform thickness on at least the surface having the depressions and protrusions pattern of the aforementioned inorganic substance layer.

The method of production of the resin mold for nanoimprinting will be described in reference to figures.

The same structures as those of FIG. 1 will be assigned the same reference numerals.

Figure 2:
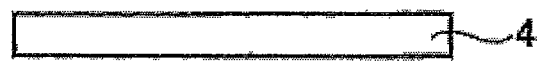
FIG. 2 shows the method for production of the resin mold for nanoimprinting of the present invention.
Figure 2:
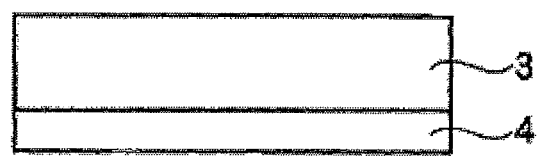
Figure 2:
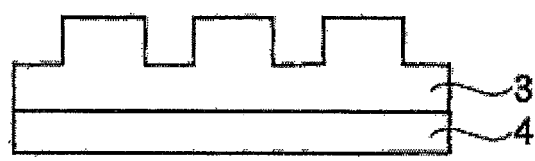
Figure 2:
Figure 2:
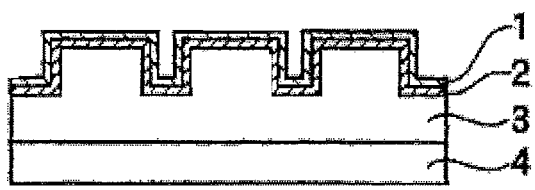

The method of production of a resin mold for nanoimprinting that has a four-layer structure will be explained in reference to FIG. 2.

A substrate 4 is prepared as shown in FIG. 2(a).

A resin layer 3 is formed on the substrate 4 as shown in FIG. 2(b).

Next, by contacting the mold against the aforementioned resin layer 3 as shown in FIG. 2(c), the depressions and protrusions pattern formed on the surface of this mold is transferred to the surface of the resin layer.

Thereafter, as shown in FIG. 2(d), the inorganic substance layer 2 of uniform thickness is formed on at least the surface having the depressions and protrusions pattern of the aforementioned resin layer 3.

Thereafter as shown in FIG. 2(e), the mold release agent layer 1 of uniform thickness is formed on at least the surface having the depressions and protrusions pattern of the aforementioned inorganic substance layer 2.

Each of these steps will be explained below. The substances composing each of the layers for the resin mold for nanoimprinting are the same as those described in the above description of the resin mold for nanoimprinting.

<Step (I): Applying an Active Energy Beam-Curable Composition Including from 1 to 50 Parts by Weight of an Epoxy Group-Containing Unsaturated Compound (Based on 100 Parts by Weight of the Total Composition) onto a Substrate>

The active energy beam-curable composition contains the epoxy group-containing unsaturated compound in the amount of 1 to 50 parts by weight, and preferably 20 to 40 parts by weight (relative to 100 parts by weight of the total composition). Furthermore, the active energy beam-curable composition preferably further contains (meth)acrylate. The (meth)acrylate content is preferably from 50 to 99 parts by weight, and more preferably is from 60 to 80 parts by weight. When the aforementioned composition includes the epoxy group-containing unsaturated compound within the aforementioned range, adhesion between the resin layer and the substrate and adhesion between the resin layer and the mold release agent layer are good. Examples of the epoxy group-containing unsaturated compound and the (meth)acrylate are as described above.

Moreover, the aforementioned active energy beam-curable composition substantially contains no compound that reacts with the epoxy group, e.g. does not contain a cross-linking agent, carboxyl group-containing compound, or cationic or anionic type initiation agent, or the like. Since the aforementioned active energy beam-curable composition does not contain such compounds, the rings of the epoxy groups of the epoxy group-containing unsaturated compound remain closed in Step (II). It is thought that adhesion between the resin layer and the substrate and adhesion between the resin layer and the mold release agent layer become good as a result. Here, the expression "contains substantially none" means that the content of the constituent units of the resin that are derived from compounds capable of reacting with the epoxy group (relative to 100 parts by weight of the total composition) are from 0 to 10 parts by weight, preferably are from 0 to 3 parts by weight, and more preferably are from 0 parts by weight.

The aforementioned active energy beam-curable composition is coated on the substrate by spin coating, spray coating, bar coating, lip coating, slit coating, or the like. Details of the substrate are as described above.

<Step (II): Contacting the Aforementioned Active Energy Beam-Curable Composition Against a Mold, Irradiating Active Energy Beam, Transferring a Depressions and Protrusions Pattern Formed in the Surface of the Aforementioned Mold, and Forming a Resin Layer Having Less than or Equal to 15 Percent Change of Epoxy Value Relative to Epoxy Value of the Aforementioned Active Energy Beam-Curable Composition>

The mold is contacted against the aforementioned active energy beam-curable composition. Then, the composition is made to react by irradiation using active energy beam to form a resin layer such that the depressions and protrusions of the mold are transferred to the surface.

The surface of the aforementioned active energy beam-curable composition is pressed against the quartz, metal, silicon, or the like mold normally used for imprinting, and irradiation is performed using active energy beam. Although no particular limitation is placed on the surface geometry (pattern) of the mold, the surface geometry preferably has a period of 10 nm to 50 µm, a depth of 10 nm to 50 µm, and a transferring surface of 1.0 to $1.0 \times 10^6$ mm$^2$. More preferably, the surface geometry has a period of 20 nm to 20 µm, a depth of 50 nm to 1 µm, and a transferring surface of 1.0 to $0.25 \times 10^6$ mm$^2$. Due to such surface geometry, it is possible to forma sufficient pattern in the resin layer. Preferably, while the mold is maintained for 0 to 120 seconds pressed against the active energy beam-curable composition at a strength of 0.1 to 10 MPa, the active energy beam-curable composition is irradiated using the active energy beam.

Examples of the active energy beam include X-rays, ultraviolet radiation, visible radiation, infrared radiation, and electron beam.

The irradiation conditions of the active energy beam is preferably from 10 to 80 mW/cm$^2$ for 1 to 240 seconds.

After irradiation using the active energy beam, the mold and resin layer separation operation is performed.

During the present step, the aforementioned epoxy group-containing unsaturated compound copolymerizes with other monomers by the ethylenic double bond without accompanying ring opening. As a result, there is no formation of a crosslinked structure derived from ring opening of the epoxy group, and the resin forming the resin layer has a structure that entirely dissolves in toluene at a concentration of 10 percent by weight on a solids basis.

Moreover, the epoxy value of the aforementioned active energy beam-curable composition of the resin composing the resin layer may be calculated based on the blended proportion of the epoxy group-containing monomer with the other monomers. There is almost no error in the epoxy value of the resin composition calculated based on the charged amounts.

Change of the epoxy value indicates the proportion of ring opening of the epoxy group in the resin layer and is expressed by the below listed Formula (1).

$$\text{Epoxy value} = 100/\text{epoxy equivalents} \quad \text{Formula (1)}$$

The amount of change of the epoxy value is a measure of the progress of the crosslinking reaction that occurs in the active energy beam-curing reaction. Although the epoxy value is a value indicating the epoxy equivalents in 100 g of the resin in the case that active energy beam is used in the above manner, and a monomer that is capable of reaction with the epoxy group is not used, this value roughly agrees with the theoretical value calculated from the charged amount of the epoxy group-containing monomer.

When the epoxy value is within the aforementioned range, and when the resin mold for nanoimprinting is used for imprinting, there is no peeling of the resin mold for nanoimprinting from the substrate, and there is no separation between the mold release agent layer and the resin layer. The amount of change of the epoxy value being in the aforementioned range means that the epoxy groups in the epoxy group-containing unsaturated compound in the active energy beam-curable composition have not been subjected to ring opening in the present step. As a result, after formation of the resin layer by the present step, unpaired electron pairs of the oxygen atoms in the remaining unopened epoxy rings express bonding ability with the resin plate, resin film, glass, inorganic substance, inorganic oxide, or the like used for the inorganic substance layer or substrate, and adhesion between the resin layer and the substrate and adhesion between the resin layer and the inorganic substance layer are excellent.

The amount of change of the epoxy value becomes this type of value when the active energy beam-curable composition used in step (I) contains substantially no compounds capable of reaction with the epoxy group, i.e. contains substantially no crosslinking agent, carboxyl group-containing compound, cationic type or anionic type initiation agent, or the like.

<Step (III): Forming an Inorganic Substance Layer of Uniform Thickness on at Least a Surface Having a Depressions and Protrusions Pattern of the Aforementioned Resin Layer>

A normal thin film forming means (e.g. vapor deposition, sputtering, or the like) is used to deposit the aforementioned inorganic substance or inorganic oxide on at least the surface having the geometry of the resin layer while the deposition workpiece is subjected to rotation or revolution to form an inorganic substance or inorganic oxide thin film of uniform thickness, i.e. preferably from 0.5 to 100 nm, more preferably from 0.5 to 20 nm, and most preferably from 1 to 10 nm. By performing such rotation or revolution and forming the inorganic substance layer while changing the rotation or revolution direction every certain time interval, thickness of the formed inorganic substance layer becomes uniform, and it is possible to correct distortion or the like of the depressions and protrusions geometry formed in the resin layer.

<Step (IV): Forming a Mold Release Agent Layer of Uniform Thickness on at Least the Surface Having the Depressions and Protrusions Pattern of the Aforementioned Inorganic Substance Layer>

On at least the surface of the aforementioned inorganic substance layer having the geometry, the aforementioned mold release agent is coated by a normal coating operation such as dip coating, spin coating, vapor deposition, spraying, or the like. Furthermore, the mold release agent may be a mold release agent diluted by an organic solvent in which the mold release agent dissolves.

After the aforementioned coating operation, rinse treatment of the surface of the mold release agent coating film is preferably performed using, for example, fluorine type solvent such as perfluorohexane. Although the aforementioned rinse treatment is preferable in order to obtain a mold release agent layer of uniform thickness, it is permissible not to perform rinse treatment if it is possible to maintain uniform thickness of the mold release agent layer by the aforementioned mold release agent coating operation.

Due to this process, a mold release agent layer is formed that preferably has a thickness of 0.5 to 20 nm, more preferably 0.5 to 15 nm, and most preferably 0.5 to 10 nm.

3. Method of Use of the Resin Mold for Nanoimprinting

(1) Normal Method of Use

The resin mold for nanoimprinting of the present invention is suitable for use for imprinting of a thermoplastic resin, thermosetting resin, or photo-curable resin. In particular, the resin mold for nanoimprinting of the present invention is suitable for use for imprinting a photo-curable resin. Thus, in order to allow more efficient completion of the photo-curing reaction, the resin mold for nanoimprinting preferably has high light transmissivity. A resin is normally used that has a light transmissivity greater than or equal to 80 percent. The epoxy groups included in the resin layer of the resin mold for nanoimprinting of the present invention remain without having been subjected to ring opening, and a crosslinked structure is not formed. Thus, the resin does not become milky-turbid, and the resin has a good light transmissivity of at least 80 percent.

Figure 3:
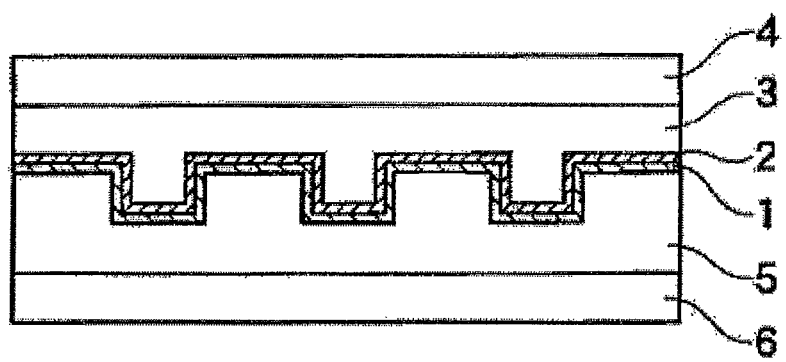
FIG. 3 shows the method of use of the resin mold for nanoimprinting of the present invention.
Figure 3:
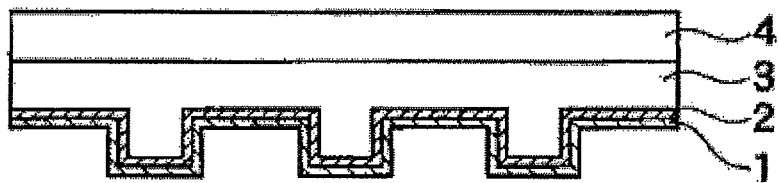
Figure 3:
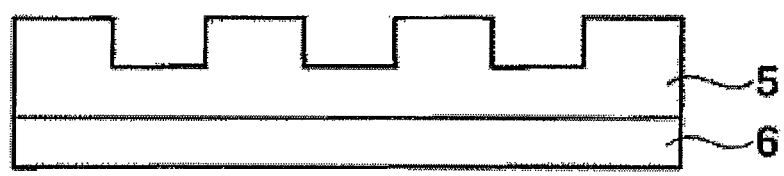

An embodiment of the method of use of the resin mold for nanoimprinting of the present invention will be described using FIG. 3.

Next, as shown in FIG. 3(a), the resin mold for nanoimprinting of the present invention is contacted against the resin 5 surface.

Next, as shown in FIG. 3(b), the resin mold for nanoimprinting of the present invention is peeled away, and a resin 5 is obtained that has the geometry formed in the surface.

<Process of Contacting the Resin Mold for Nanoimprinting Against the Resin Surface>

The resin 5 to be imprinted is normally a thermoplastic resin, thermosetting resin, or photo-curable resin, and the resin 5 to be imprinted is normally on a substrate 6.

Any substrate may be used without limitation as the substrate 6 provided that it is a substrate normally used for imprinting, as exemplified by resins, glasses, silicon, sapphire, gallium nitride, carbon, silicon carbide, or the like.

If a thermoplastic resin or thermosetting resin is used, it is possible to use the procedure used for thermal imprinting a normal thermoplastic resin or thermosetting resin. However, processing is preferably performed by pressing the mold at a pressure of 0.5 to 50 MPa for a time of 10 to 600 seconds against the resin heated to a temperature greater than or equal to the glass transition temperature (Tg).

Any generally used thermoplastic resin or thermosetting resin may be used without limitation as the thermoplastic resin or thermosetting resin.

If a photo-curable resin is used, it is possible to use the operation normally used for photo imprinting of a photo-curable resin. However, the procedure is preferably performed by irradiation using active energy beam (i.e. ultraviolet radiation or the like) while maintaining contact of the mold against the resin at a pressure of 0.1 to 10 MPa for 0 to 600 seconds.

In photo imprinting of the photo-curable resin, since greater pressure is not required than that for thermal imprinting in the above described manner, it is possible to preferably use various types of embodiments of the resin mold for nanoimprinting of the present invention. For example, a flexible embodiment of the resin mold for nanoimprinting or the like using a film or the like on the substrate may be used with advantage for photo imprinting of the photo-curable resin.

Any general photo-curable resin may be used as the photo-curable resin without limitation.

<Step of Separating the Resin and Resin Mold for Nanoimprinting>

When a thermoplastic resin or thermosetting resin is used, the resin is cooled to a temperature less than or equal to the glass transition temperature (Tg), and the resin layer and the mold are separated.

When a photo-curable resin is used, the mold and resin layer are separated after causing curing of the resin using active energy beam.

Figure 4:
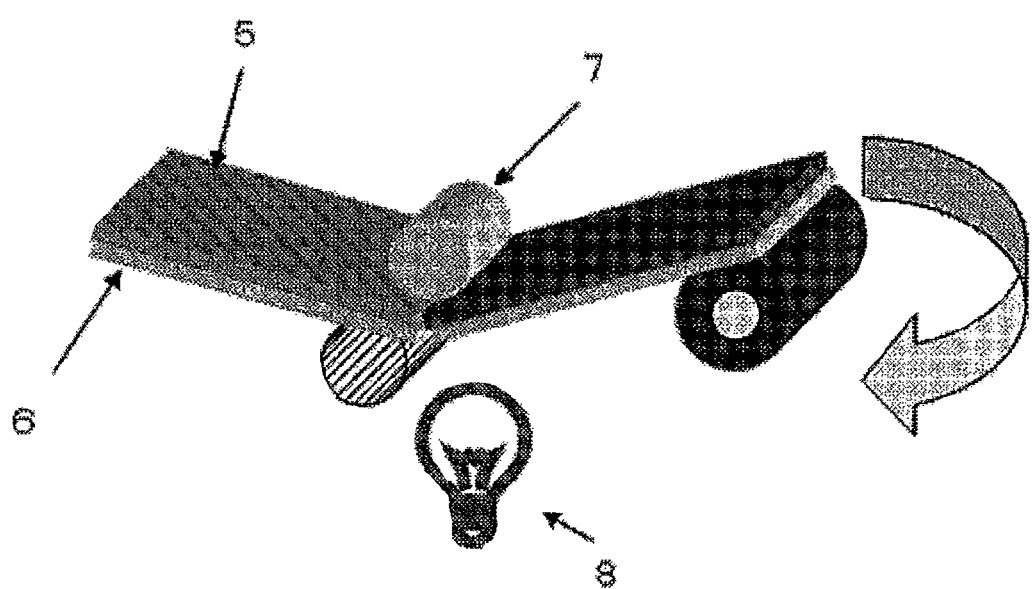
FIG. 4 shows the method of use of the roller type resin mold for nanoimprinting.

An example was indicated above using stamping and utilizing the resin mold for nanoimprinting of the present invention. However, the resin mold for nanoimprinting of the present invention may be wrapped around a roller in the below indicated manner to prepare a resin mold roller for nanoimprinting, and a feed roller may be prepared. As shown in FIG. 4, the resin film may be passed between the resin mold roller for nanoimprinting and the feed roller, this resin film may be irradiated using an active energy beam such as ultraviolet radiation, and the depressions and protrusions geometry formed in the resin mold may be transferred and fixed to the resin film. This method will be described below.

<Method Using Roller Type Resin Mold for Nanoimprinting>

The resin mold for nanoimprinting of the present invention can be used as a roller type resin mold for nanoimprinting by wrapping the resin mold upon a roller or the like.

A roller type resin mold for nanoimprinting is suitable for use for imprinting of a photo-curable resin. As shown in FIG. 4, the step of contacting the resin mold for nanoimprinting against the aforementioned resin surface includes pressing the resin mold for nanoimprinting wrapped onto the roller against the surface of the resin, and then performing ultraviolet radiation irradiation.

In this manner, the resin mold for nanoimprinting of the present invention is utilized when using a roller.

As shown in FIG. 4, a roller type resin mold for nanoimprinting is a mold of a configuration similar to the aforementioned resin mold for nanoimprinting where the mold is in a form wound upon a roller or the like with the depressions and protrusions surface oriented outwardly.

A preferred configuration of the roller type resin mold for nanoimprinting has a flexible structure of 30 to 300 μm thickness as a four-layer mold.

The resin mold for nanoimprinting of the present invention is used for imprinting of a thermoplastic resin, thermosetting resin, or photo-curable resin.

The various products obtained from the imprinted resin may be used for semiconductor materials, optical elements, prisms, micro lenses, memory media, holography, micromachines, biotech products, environmental products, and electronic materials such as semiconductors, LEDs, hard discs, or the like.

A surface pattern geometry period of 20 nm to 500 nm is preferred for use in semiconductor materials, media, optical elements, or the like. A surface pattern geometry period of 200 nm to 20 μm is suitable for use in prisms, micro lenses, or the like.

If the resin mold for nanoimprinting of the present invention is a roller type resin mold for nanoimprinting, the resin mold may be used for continuous molding, and such a roller type resin mold for nanoimprinting is preferably used for producing optically functional films such as a micro lens film, anti-reflective film, or the like.

EXAMPLES

Although the present invention is explained below further based on examples, the present invention is not limited by these examples.

In the specification of the present application and in the examples, various values were measured by the below described measurement methods.

<Film Thickness of the Resin Layer>

Film thickness of the resin layer was taken to be the distance between the bottom face of the resin layer and the highest face within the surface having the depressions and protrusions pattern.

<Film Thickness/Pattern Height>

This is the value of the resin layer film thickness (indicated by Y within FIG. 1) divided by the pattern height (indicated by X within FIG. 1).

<Cure Shrinkage>

This was found by measuring width of the concavities or protuberances of the transfer product using the below listed formula.

cure shrinkage=((width of concavity or protuberance of the transfer product−width of concavity or protuberance of the master mold)/width of the concavity or protuberance of the master mold)× 100

<Cure Stability>

The presence or absence of tackiness of the surface of the cured product was checked after curing, and this was evaluated by the below listed criteria.

○: There was no tackiness.

x: There was tackiness.

<Thickness of the Inorganic Substance Layer>

A thickness measurement device (model F20, manufactured by Filmetrics Inc.) was used. Measurement was performed at 5 arbitrary locations within the surface, and the average value was taken to be thickness of the oxide film layer. Uniformity of thickness was checked by the standard deviation of the aforementioned 5 points.

<Thickness of the Mold Release Agent Layer>

A thickness measurement device (model F20, manufactured by Filmetrics Inc.) was used. Measurement was performed at 5 arbitrary locations within the surface, and the average value was taken to be thickness of the mold release agent layer. Uniformity of thickness was checked by the standard deviation of the aforementioned 5 points.

<Surface Geometry (Pattern)>

The period and line width were evaluated by SEM (S-4800, manufactured by Hitachi High Technologies Corp.), and depth (height) was evaluated using an AFM (L-Trace, manufactured by SII NanoTechnology, Inc.).

<Surface Smoothness>

Surface smoothness of the resin mold for nanoimprinting of the present invention was measured using an optical interference type surface profiler, (model: WYKO-1100, manufactured by Veeco), and the results were evaluated by the below listed criteria.

○: There were no irregularities or undulations greater than or equal to 100 nm.

x: There were irregularities or undulations greater than or equal to 100 nm.

<Peeling>

The presence or absence of peeling between the resin layer and the substrate of the resin mold for nanoimprinting due to imprinting was observed using an optical microscope (product name: LV-100, manufactured by Nikon Corp.) and was evaluated by the below listed criteria.

YES: There was peeling of the resin layer from the substrate.

NO: There was no peeling of the resin layer from the substrate.

<Cracking>

The presence or absence of cracks in the resin mold for nanoimprinting after imprinting was observed by use of an optical microscope (product name: LV-100, manufactured by Nikon Corp., 20× magnification) and was evaluated by the below listed criteria.

YES: There were cracks in the resin mold for nanoimprinting.

NO: There were no cracks in the resin mold for nanoimprinting.

<Transfer-Attachment>

The presence or absence of attachment of the resin undergoing imprinting to the surface of the resin mold for nanoimprinting was observed using an optical microscope (product name: LV-100, manufactured by Nikon Corp., 20× magnification), and was evaluated by the below listed criteria.

YES: There was attachment of the resin undergoing imprinting to the surface of the resin mold for nanoimprinting.

NO: There was no attachment of the resin undergoing imprinting to the surface of the resin mold for nanoimprinting.

<Pattern Defects>

The surface of the resin mold was observed visually and was evaluated by the below listed criteria.

○: Diffracted light was visible.

x: Diffracted light was not visible.

<Transfer Count>

Based on the count of imprintings that were possible without the occurrence of the aforementioned "peeling," "cracking," "transfer-attachment," and "pattern defect," the transfer count was evaluated by the below listed criteria.

●: 30 to 50 times.

○: 20 to 30 times.

x: Less than 20 times.

<Resin Solubility>

To the monomer mixture of the composition listed in Table 6 was further added and mixed 10 parts by weight of the initiator (Irgacure 184, manufactured by Nagase & Co., Ltd.). This was fed into a mold to produce a photo-polymerization resin solution of 1 mm thickness, and a polymer was produced by irradiation for 4 minutes using UV light at a wavelength of 365 nm. The result of solubility testing of this polymer at 10 percent by weight solids content in toluene was evaluated by the below listed criteria.

○: The solids entirely dissolved.

x: Solids remained undissolved, or the solution was milky-turbid.

<Epoxy Value>

Epoxy value was indicated as the gram equivalents (equivalents per 100 g) of the epoxy groups included in a 100 g sample. The measurement was performed in accordance with JIS K7236 (1986). To 0.5 g of the sample used for resin solubility evaluation was added 50 mL of a mixed solution of acetic acid and toluene (volume ratio=1:1). Then 0.1 mL of tetraethyl ammonium bromide—acetic acid solution was added and mixed. Thereafter, potentiometric titration was performed using 0.1 N perchloric acid—acetic acid solution, the epoxy equivalents were found, and the epoxy value was calculated from the formula: epoxy value=100/epoxy equivalents.

Furthermore, epoxy value was measured in the same manner for 0.5 g of a sample solution of 10 percent by weight solids content of the monomer mixture prior to polymerization dissolved in toluene.

Example 1

(1) Formation of the Resin Layer

A photo-curable resin solution of 75 parts by weight of isobornyl acrylate (IBXA), 15 parts by weight of dipentaerythritol hexaacrylate (DPHA), and 10 parts by weight of glycidyl methacrylate (GMA) was spin coated on a polyethylene terephthalate (PET, 0.125 mm thickness) film to obtain a 1,000 nm thick resin film. Thereafter, a nickel mold (70 mm square transferring surface, 350 nm period, 350 nm depth) having moth-eye-pattern depressions and protrusions on the surface was pressed at 0.4 MPa against the resin film, and the resin film was cured using UV irradiation (10 mW/cm$^2$, 1 minute). Thereafter, the resin film was subjected to demolding to obtain a resin sheet imprinted with the geometry. The ratio of resin film thickness to pattern height was 6.0.

(2) Formation of the Inorganic Substance Layer

Upon the resin sheet having the imprinted surface obtained during step (1), an oxide coating film of $SiO_2$ was formed of 10 nm thickness by the rotation/revolution type vapor deposition method to produce the inorganic substance layer. Vacuum vapor deposition was performed for about 1 minute at room temperature using an optical thin film coater (OPTORUN OMC-1100). After vapor deposition, the inorganic substance layer was checked visually to see whether there were cracks or pattern defects of the surface geometry.

(3) Formation of the Mold Release Agent Layer

After the laminate of the inorganic substance layer, the photo-cured resin layer, and the substrate obtained during step (2) was dipped for 1 minute in a perfluoro-based fluorine type mold release agent (product name=OPTOOL DSX, manufactured by Daikin Industries, Ltd.), the laminate was pulled up and placed for 1 hour in a warm and humid environment at 70° C. and 90% relative humidity. Thereafter, the laminate was rinsed using a fluorine type solvent (product name=HD-TH, manufactured by Harves Co.), and the laminate was left for 24 hours in a 23° C. and 65% relative humidity environment to complete mold release agent layer treatment. Thickness was 3 nm.

There were no defects or pattern changes in the patterned part (70 mm square transferring surface, 350 nm period, 350 nm depth).

The resin mold for nanoimprinting shown in Table 1 was produced by the aforementioned steps.

The produced resin mold for nanoimprinting was used to perform the below described imprinting.

(4) Photo Imprinting Using the Resin Mold for Nanoimprinting 0.2 mL of a photo-curing resin (product name=PAK-02, manufactured by Toyo Gosei Co., Ltd.) was dropped onto the resin mold for nanoimprinting obtained during step (3), the droplet was covered by a polycarbonate film (product name=Lexan, manufactured by Asahi Glass Co., Ltd.), and a photo-nano imprinter device (manufactured by Engineering System Co., Ltd.) was used to perform imprinting by pressing at 0.4 MPa for 2 minutes, and then irradiating ultraviolet radiation (10 mW/cm$^2$) for 2 minutes. Thereafter, the resin mold for nanoimprinting was removed, and the mold was checked to confirm that there were no transfer defects.

Moreover, when this resin mold for nanoimprinting was used for 20 consecutive shots of photo nanoimprinting, printing was possible without problems.

Example 2

Except for use of 80 parts by weight of isobornyl acrylate (IBXA), 15 parts by weight of dipentaerythritol hexaacrylate (DPHA), and 5 parts by weight of glycidyl methacrylate (GMA), a resin mold for nanoimprinting was produced in the same manner as that of Example 1. Furthermore, the obtained resin mold for nanoimprinting was used to perform imprinting in the same manner as that of Example 1. The obtained resin mold for nanoimprinting and the imprinting results are shown in Table 1.

Moreover, when this resin mold for nanoimprinting was used for 20 consecutive shots of photo imprinting, printing was possible without problems.

Example 3

Except for use of 65 parts by weight of isobornyl acrylate (IBXA), 15 parts by weight of dipentaerythritol hexaacrylate (DPHA), and 20 parts by weight of glycidyl methacrylate (GMA), a resin mold for nanoimprinting was produced in the same manner as that of Example 1. Furthermore, the obtained resin mold for nanoimprinting was used to perform imprinting in the same manner as that of Example 1. The obtained resin mold for nanoimprinting and the imprinting results are shown in Table 1.

Moreover, when this resin mold for nanoimprinting was used for 20 consecutive shots of photo imprinting, printing was possible without problems.

Example 4

Except for use of 75 parts by weight of methyl methacrylate (MMA) in place of the isobornyl acrylate (IBXA), use of 15 parts by weight of dipentaerythritol hexaacrylate (DPHA), and use of 20 parts by weight of glycidyl methacrylate (GMA), a resin mold for nanoimprinting was produced in the same manner as that of Example 1. Furthermore, the obtained resin mold for nanoimprinting was used to perform imprinting in the same manner as that of Example 1. The obtained resin mold for nanoimprinting and the imprinting results are shown in Table 1.

Moreover, when this resin mold for nanoimprinting was used for 20 consecutive shots of photo imprinting, printing was possible without problems.

Example 5

Except for use of 30 parts by weight of isobornyl acrylate (IBXA), 15 parts by weight of dipentaerythritol hexaacrylate (DPHA), and 45 parts by weight of glycidyl methacrylate (GMA), a resin mold for nanoimprinting was produced in the same manner as that of Example 1. Furthermore, the obtained resin mold for nanoimprinting was used to perform imprinting in the same manner as that of Example 1. The obtained resin mold for nanoimprinting and the imprinting results are shown in Table 1.

Moreover, when this resin mold for nanoimprinting was used for 20 consecutive shots of photo imprinting, printing was possible without problems.

Comparative Example 1

Except for use of 25 parts by weight of isobornyl acrylate (IBXA), 5 parts by weight of dipentaerythritol hexaacrylate (DPHA), and 70 parts by weight of glycidyl methacrylate (GMA), a resin mold for nanoimprinting was produced in the same manner as that of Example 1.

Furthermore, the obtained resin mold for nanoimprinting was used to perform imprinting in the same manner as that of Example 1. The obtained resin mold for nanoimprinting and the imprinting results are shown in Table 1.

Moreover, this resin mold for nanoimprinting was used to perform consecutive photo imprinting. Cracks were observed visually at the 5th shot, and pattern defects were observed.

Comparative Example 2

Except for use of 15 parts by weight of isobornyl acrylate (IBXA), 15 parts by weight of dipentaerythritol hexaacrylate (DPHA), and 70 parts by weight of glycidyl methacrylate (GMA), a resin mold for nanoimprinting was produced in the same manner as that of Example 1. Furthermore, the obtained resin mold for nanoimprinting was used to perform imprinting in the same manner as that of Example 1. The obtained resin mold for nanoimprinting and the imprinting results are shown in Table 1.

Moreover, this resin mold for nanoimprinting was used to perform consecutive photo imprinting. Pattern defects were visible at the 10th shot.

Comparative Example 3

Except for use of 84.5 parts by weight of isobornyl acrylate (IBXA), 15 parts by weight of dipentaerythritol hexaacrylate (DPHA), and 0.5 parts by weight of glycidyl methacrylate (GMA), a resin mold for nanoimprinting was produced in the same manner as that of Example 1. Furthermore, the obtained resin mold for nanoimprinting was used to perform imprinting in the same manner as that of Example 1. The obtained resin mold for nanoimprinting and the imprinting results are shown in Table 1.

Moreover, this resin mold for nanoimprinting was used to perform consecutive photo imprinting. Peeling and transfer-attachment occurred at the 15th shot.

Comparative Example 4

Except for use of 70 parts by weight of isobornyl acrylate (IBXA), use of 15 parts by weight of dipentaerythritol hexaacrylate (DPHA), and use of 15 parts by weight of phenoxyethyl acrylate (POA) in place of the glycidyl methacrylate (GMA), a resin mold for nanoimprinting was produced in the same manner as that of Example 1. Furthermore, the obtained resin mold for nanoimprinting was used to perform imprinting in the same manner as that of Example 1. The obtained resin mold for nanoimprinting and the imprinting results are shown in Table 1.

Moreover, this resin mold for nanoimprinting was used to perform consecutive photo imprinting. Cracking occurred and pattern defects were observed at the 3rd shot.

Comparative Example 5

Except for use of 70 parts by weight of isobornyl acrylate (IBXA), use of 15 parts by weight of dipentaerythritol hexaacrylate (DPHA), and use of 15 parts by weight of lauryl acrylate (LA) in place of the glycidyl methacrylate (GMA), a resin mold for nanoimprinting was produced in the same manner as that of Example 1. Furthermore, the obtained resin mold for nanoimprinting was used to perform imprinting in the same manner as that of Example 1. The obtained resin mold for nanoimprinting and the imprinting results are shown in Table 1.

Moreover, when this resin mold for nanoimprinting was used, peeling and cracking occurred at the 1st shot. Pattern defects were also observed.

Comparative Example 6

Except for use of 50 parts by weight of isobornyl acrylate (IBXA), 50 parts by weight of dipentaerythritol hexaacrylate (DPHA), and 0 parts by weight of glycidyl methacrylate (GMA), a resin mold for nanoimprinting was produced in the same manner as that of Example 1. Furthermore, the obtained resin mold for nanoimprinting was used to perform imprinting in the same manner as that of Example 1. The obtained resin mold for nanoimprinting and the imprinting results are shown in Table 1.

Moreover, this resin mold for nanoimprinting was used to perform consecutive photo imprinting. Peeling occurred at the 5th shot.

Comparative Example 7

Except for use of 75 parts by weight of isobornyl acrylate (IBXA), use of 15 parts by weight of dipentaerythritol hexaacrylate (DPHA), and use of 10 parts by weight of acrylic acid (AA) in place of the glycidyl methacrylate (GMA), a resin mold for nanoimprinting was produced in the same manner as that of Example 1.

Furthermore, the obtained resin mold for nanoimprinting was used to perform imprinting in the same manner as that of Example 1. The obtained resin mold for nanoimprinting and the imprinting results are shown in Table 2.

Moreover, this resin mold for nanoimprinting was used to perform consecutive photo imprinting. Peeling occurred at the 8th shot.

Comparative Example 8

Except for use of 75 parts by weight of isobornyl acrylate (IBXA), use of 15 parts by weight of dipentaerythritol hexaacrylate (DPHA), and use of 10 parts by weight of 4-hydroxybutylacrylate (4HBA) in place of the glycidyl methacrylate (GMA), a resin mold for nanoimprinting was produced in the same manner as that of Example 1. Furthermore, the obtained resin mold for nanoimprinting was used to perform imprinting in the same manner as that of Example 1. The obtained resin mold for nanoimprinting and the imprinting results are shown in Table 2.

Moreover, this resin mold for nanoimprinting was used to perform consecutive photo imprinting. Peeling occurred at the 15th shot.

Comparative Example 9

Except for use of 75 parts by weight of isobornyl acrylate (IBXA), use of 15 parts by weight of dipentaerythritol hexaacrylate (DPHA), and use of 10 parts by weight of dimethylamino ethyl acrylate (DMAEA) in place of the glycidyl methacrylate (GMA), a resin mold for nanoimprinting was produced in the same manner as that of Example 1. Furthermore, the obtained resin mold for nanoimprinting was used to perform imprinting in the same manner as that of Example 1. The obtained resin mold for nanoimprinting and the imprinting results are shown in Table 2.

Moreover, this resin mold for nanoimprinting was used to perform consecutive photo imprinting. Peeling occurred at the 5th shot.

Comparative Example 10

Except for use of 75 parts by weight of isobornyl acrylate (IBXA), use of 15 parts by weight of dipentaerythritol hexaacrylate (DPHA), use of 5 parts by weight of glycidyl methacrylate (GMA), and use of 5 parts by weight of acrylic acid (AA), a resin mold for nanoimprinting was produced in the same manner as that of Example 1. Furthermore, the obtained resin mold for nanoimprinting was used to perform imprinting in the same manner as that of Example 1. The obtained resin mold for nanoimprinting and the imprinting results are shown in Table 2.

Moreover, this resin mold for nanoimprinting was used to perform consecutive photo imprinting. At the 10th shot, peeling and transfer-attachment occurred.

Comparative Example 11

Except for use of 100 parts by weight of dimethylsiloxane (PDMS) in place of the isobornyl acrylate (IBXA), dipentaerythritolhexaacrylate (DPHA), and glycidyl methacrylate (GMA), a resin mold for nanoimprinting was produced in the same manner as that of Example 1. Furthermore, the obtained resin mold for nanoimprinting was used to perform imprinting in the same manner as that of Example 1. The obtained resin mold for nanoimprinting and the imprinting results are shown in Table 1.

Moreover, when this resin mold for nanoimprinting was used to perform photo imprinting, peeling and transfer-attachment occurred at the 1st shot. Pattern defects were also seen.

Comparative Example 12

Except for use of 60 parts by weight of dipentaerythritol hexaacrylate (DPHA) and 40 parts by weight of neopentylglycol acrylate (A-NPG), without use of the isobornyl acrylate (IBXA) and glycidyl methacrylate (GMA), a resin mold for nanoimprinting was produced in the same manner as that of Example 1. Furthermore, the obtained resin mold for nanoimprinting was used to perform imprinting in the same manner as that of Example 1. The obtained resin mold for nanoimprinting and the imprinting results are shown in Table 1.

Moreover, when this resin mold for nanoimprinting was used to perform photo imprinting, peeling and transfer-attachment occurred at the 1st shot.

TABLE 1

| | | | Example 1 | Example 2 | Example 3 | Example 4 | Example 5 | Comparative Example 1 | Comparative Example 2 | Comparative Example 3 |
|---|---|---|---|---|---|---|---|---|---|---|
| substrate material layer | type of substrate | | PET | | | | | | | |
| resin layer | composition | IBXA | 75 | 80 | 65 | | 30 | 25 | 15 | 84.5 |
| | | MMA | | | | 75 | | | | |
| | | POA | | | | | | | | |
| | | LA | | | | | | | | |
| | | A-NPG | | | | | | | | |
| | | DPHA | 15 | 15 | 15 | 15 | 15 | 5 | 15 | 15 |
| | | GMA | 10 | 5 | 20 | 20 | 45 | 70 | 70 | 0.5 |
| | | PDMS | | | | | | | | |
| | transfer pattern | | moth-eye | moth-eye | moth-eye | moth-eye | moth-eye | moth-eye | moth-eye | moth-eye |
| | pattern height (nm) | | 350 | 350 | 350 | 350 | 350 | 350 | 350 | 350 |
| | film thickness (nm) | | 1000 | 1000 | 1000 | 1000 | 1000 | 1000 | 1000 | 1000 |
| | film thickness/pattern height | | 2.85 | 2.85 | 2.85 | 2.85 | 2.85 | 2.85 | 2.85 | 2.85 |
| | cure shrinkage | | 3% | 3% | 3% | 3% | 3% | 3% | 3% | 3% |
| | cure stability | | ○ | ○ | ○ | ○ | ○ | ○ | ○ | ○ |
| oxide film layer | type of oxide | | $SiO_2$ | $SiO_2$ | $SiO_2$ | $SiO_2$ | $SiO_2$ | $SiO_2$ | $SiO_2$ | $SiO_2$ |
| | film thickness | | 10 nm | 10 nm | 10 nm | 10 nm | 10 nm | 10 nm | 10 nm | 10 nm |
| mold release agent layer | mold release agent | | DSX | DSX | DSX | DSX | DSX | DSX | DSX | DSX |
| results of evaluation | UV nanoimprinting | surface smoothness | ○ | ○ | ○ | ○ | ○ | ○ | ○ | ○ |
| | | peeling | NO | NO | NO | NO | NO | NO | NO | YES |
| | | cracking | NO | NO | NO | NO | NO | YES | NO | YES |
| | | transfer-attachment | NO | NO | NO | NO | NO | NO | NO | NO |
| | | pattern defect | ○ | ○ | ○ | ○ | ○ | x | x | ○ |
| | | transfer count | ● | ● | ● | ● | ○ | x | x | x |
| | epoxy value ($\times 10^{-2}$) *1 | | 0.7 | 0.35 | 1.41 | 1.41 | 3.15 | 4.9 | 4.9 | 0.035 |

| | | | Comparative Example 4 | Comparative Example 5 | Comparative Example 6 | Comparative Example 11 | Comparative Example 12 |
|---|---|---|---|---|---|---|---|
| substrate material layer | type of substrate | | PET | | | | |
| resin layer | composition | IBXA | 70 | 70 | 50 | | |
| | | MMA | | | | | |
| | | POA | | 15 | | | |
| | | LA | | | 15 | | |
| | | A-NPG | | | | | 40 |

TABLE 1-continued

|  |  |  |  |  |  |  |  |
|---|---|---|---|---|---|---|---|
|  |  | DPHA | 15 | 15 | 50 |  | 60 |
|  |  | GMA |  |  |  |  |  |
|  |  | PDMS |  |  |  | 100 |  |
|  |  | transfer pattern | moth-eye | moth-eye | moth-eye | moth-eye | moth-eye |
|  |  | pattern height (nm) | 350 | 350 | 350 | 350 | 350 |
|  |  | film thickness (nm) | 1000 | 1000 | 1000 | 1000 | 1000 |
|  |  | film thickness/pattern height | 2.85 | 2.85 | 2.85 | 2.85 | 2.85 |
|  |  | cure shrinkage | 3% | 3% | 7% | — | — |
|  |  | cure stability | ○ | ○ | x | — | — |
| oxide film layer | | type of oxide | $SiO_2$ | $SiO_2$ | $SiO_2$ | $SiO_2$ | $SiO_2$ |
| | | film thickness | 10 nm | 10 nm | 10 nm | 5 nm | 5 nm |
| mold release agent layer | | mold release agent | DSX | DSX | DSX | DSX | DSX |
| results of evaluation | UV nano-imprinting | surface smoothness | ○ | ○ | ○ | — | — |
|  |  | peeling | NO | YES | YES | YES | YES |
|  |  | cracking | YES | YES | NO | YES | YES |
|  |  | transfer-attachment | NO | NO | NO | NO | NO |
|  |  | pattern defect | x | x | ○ | x | ○ |
|  |  | transfer count | x | x | x | x | x |
|  | epoxy value (×$10^{-2}$) *1 |  | — | — | — | — | — |

Transfer count:
● = 30 to 50 times,
○ = 20 to 30 times,
x = less than or equal to 20 times.
*1: Calculated based on composition ratios

TABLE 2

|  |  |  | Example 1 | Comparative Example 7 | Comparative Example 8 | Compartive Example 9 | Compartive Example 10 |
|---|---|---|---|---|---|---|---|
| substrate material layer | type of substrate |  | PET |  | PET |  |  |
| resin layer | composition | IBXA | 75 | 75 | 75 | 75 | 75 |
|  |  | DPHA | 15 | 15 | 15 | 15 | 15 |
|  |  | GMA | 10 |  |  |  | 5 |
|  |  | AA |  | 10 |  |  | 5 |
|  |  | 4HBA |  |  | 10 |  |  |
|  |  | DMAEA |  |  |  | 10 |  |
|  | transfer pattern |  | moth-eye | moth-eye | moth-eye | moth-eye | moth-eye |
|  | pattern height (nm) |  | 350 | 350 | 350 | 350 | 350 |
|  | film thickness (nm) |  | 1000 | 1000 | 1000 | 1000 | 1000 |
|  | film thickness/pattern height |  | 2.85 | 2.85 | 2.85 | 2.85 | 2.85 |
|  | cure shrinkage |  | 3% | 3% | 3% | 3% | 3% |
|  | cure stability |  | ○ | ○ | ○ | ○ | ○ |
| oxide film layer | type of oxide |  | $SiO_2$ | $SiO_2$ | $SiO_2$ | $SiO_2$ | $SiO_2$ |
|  | film thickness |  | 10 nm | 10 nm | 10 nm | 10 nm | 10 nm |
| mold release agent layer | mold release agent |  | DSX | DSX | DSX | DSX | DSX |
| results of evaluation | UV nano-imprinting | surface smoothness | ○ | ○ | ○ | ○ | ○ |
|  |  | peeling | NO | YES | YES | YES | YES |
|  |  | cracking | NO | NO | NO | NO | NO |
|  |  | transfer-attachment | NO | NO | NO | NO | YES |
|  |  | pattern defect | ○ | ○ | ○ | ○ | ○ |
|  |  | transfer count | ○ | x | x | x | x |

Example 6

Except for change of the master mold of step (3) of Example 1 to a nickel mold (25 mm square transferring surface, 165 nm hole diameter, 450 nm period, 165 nm depth, cylindrical column shape) having circular column-shaped depressions and protrusions on the surface, a resin mold for nanoimprinting was produced in the same manner as that of Example 1. Furthermore, using the resin mold for nanoimprinting, imprinting was performed in the same manner as that of Example 1. The obtained resin mold for nanoimprinting and the results of imprinting are shown in Table 3.

Moreover, when this resin mold for nanoimprinting was used for 20 consecutive shots of photo imprinting, printing was possible without problems.

Example 7

Except for change of the master mold of step (3) of Example 1 to a nickel mold (35 mm square transferring surface, 75 nm L/S, 150 nm period, 150 nm depth, linear shape) having a linear depressions and protrusions structure on the surface, a resin mold for nanoimprinting was produced in the same manner as that of Example 1. Furthermore, the obtained resin mold for nanoimprinting was used to perform imprinting in the same manner as that of Example 1. The obtained resin mold for nanoimprinting and the results of imprinting are shown in Table 3.

Moreover, when this resin mold for nanoimprinting was used for 20 consecutive shots of photo imprinting, printing was possible without problems.

Example 8

Except for change of the coating amount of photo-curable resin solution onto the polyethylene terephthalate (PET) so as to obtain a film thickness of 1,800 nm, and so that ratio of the resin film thickness to pattern height was set to 5.1, a resin mold for nanoimprinting was produced in the same manner as that of Example 1. Furthermore, using the resin mold for nanoimprinting, imprinting was performed in the same manner as that of Example 1. The obtained resin mold for nanoimprinting and the results of imprinting are shown in Table 3.

Moreover, when this resin mold for nanoimprinting was used for 20 consecutive shots of photo imprinting, printing was possible without problems.

Example 9

Except for change of the coating amount of photo-curable resin solution onto the polyethylene terephthalate (PET) so as to obtain a film thickness of 3,500 nm, and so that ratio of the resin film thickness to pattern height was set to 10.0, a resin mold for nanoimprinting was produced in the same manner as that of Example 1. Furthermore, using the resin mold for nanoimprinting, imprinting was performed in the same manner as that of Example 1. The obtained resin mold for nanoimprinting and the results of imprinting are shown in Table 3.

Moreover, when this resin mold for nanoimprinting was used for 20 consecutive shots of photo imprinting, printing was possible without problems.

TABLE 3

| | | | Example 1 | Example 6 | Example 7 | Example 8 | Example 9 |
|---|---|---|---|---|---|---|---|
| substrate material layer | type of substrate | | PET | | | | |
| resin layer | composition | IBXA | 75 | 75 | 75 | 75 | 75 |
| | | DPHA | 15 | 15 | 15 | 15 | 15 |
| | | GMA | 10 | 10 | 10 | 10 | 10 |
| | transfer pattern | | moth-eye | column | 75 nm L/S | moth-eye | moth-eye |
| | pattern height (nm) | | 350 | 165 | 150 | 350 | 350 |
| | film thickness (nm) | | 1000 | 1000 | 1000 | 1800 | 3500 |
| | film thickness/pattern height | | 2.85 | 6.01 | 6.67 | 5.14 | 10 |
| | cure shrinkage | | 3% | 3% | 3% | 3% | 3% |
| | cure stability | | ○ | ○ | ○ | ○ | ○ |
| oxide film layer | type of oxide | | $SiO_2$ | $SiO_2$ | $SiO_2$ | $SiO_2$ | $SiO_2$ |
| | film thickness | | 10 nm | 10 nm | 10 nm | 10 nm | 10 nm |
| mold release agent layer | mold release agent | | DSX | DSX | DSX | DSX | DSX |
| results of evaluation | UV nano-imprinting | surface smoothness | ○ | ○ | ○ | ○ | ○ |
| | | peeling | NO | NO | NO | NO | NO |
| | | cracking | NO | NO | NO | NO | NO |
| | | transfer-attachment | NO | NO | NO | NO | NO |
| | | pattern defect | ○ | ○ | ○ | ○ | ○ |
| | | transfer count | ○ | ○ | ○ | ○ | ○ |

Reference Example 1

The resin mold for nanoimprinting of Example 1 was used, and the following imprinting was used rather than the procedure of step (4) of Example 1.

The resin mold for nanoimprinting obtained in Example 1 was wrapped around a 6 inch diameter roll. Polycarbonate film (Lexan film, 0.12 mm thickness, manufactured by Asahi Glass Co., Ltd.) coated with photo-curing resin (product name=PAK-02, manufactured by Toyo Gosei Co., Ltd.) was run through the line while pressed at 1.0 MPa (run speed=0.75 mm/second). Thereafter, ultraviolet irradiation (80 mW/cm$^2$) was performed while the line was driven, and the resin was cured. Thereafter, the resin mold for nanoimprinting was removed from the roll. Lack of defects (such as shedding of the mold release agent layer on the mold) was checked, and results of imprinting are shown in Table 4.

TABLE 4

| | | | Example 1 | Reference Example 1 |
|---|---|---|---|---|
| substrate material layer | type of substrate | | PET | |
| resin layer | composition | IBXA | 75 | |
| | | DPHA | 15 | |
| | | GMA | 10 | |
| | transfer pattern | | moth-eye | |
| | pattern height (nm) | | 350 | |
| | film thickness (nm) | | 1000 | |
| | film thickness/pattern height | | 2.85 | |
| | cure shrinkage | | 3% | |
| | cure stability | | ○ | |
| oxide film layer | type of oxide | | $SiO_2$ | |
| | film thickness | | 10 nm | |

TABLE 4-continued

|  |  | Example 1 | Reference Example 1 |
|---|---|---|---|
| mold release agent layer | mold release agent | DSX | |
| imprinting method | | UV/sheet | UV/roll |
| results of evaluation | UV nanoimprinting surface smoothness | ○ | ○ |
| | peeling | NO | NO |
| | cracking | NO | NO |
| | transfer-attachment | NO | NO |

Reference Example 2

Except for setting the pressure of the nickel mold for step (1) of Example 1 to 0.8 MPa, and performing UV irradiation for 10 seconds at 10 mW/cm² to cure the resin film, a resin mold for nanoimprinting was produced in the same manner as that of Example 1. The geometry of the obtained resin mold for nanoimprinting is shown in Table 5.

Reference Example 3

Except for performing UV irradiation for curing the resin film using 50 mW/cm² for 2 seconds in the step (1) of Example 1, a resin mold for nanoimprinting was produced in the same manner as that of Example 1. The geometry of the obtained resin mold for nanoimprinting is shown in Table 5.

Reference Example 4

Except for setting pressure of the nickel mold to 3 MPa in step (1) of Example 1, and performing the UV irradiation for curing the resin film for 10 seconds at 10 mW/cm², a resin mold for nanoimprinting was produced in the same manner as that of Example 1. The geometry of the obtained resin mold for nanoimprinting is shown in Table 5.

TABLE 5

| | | | Example 2 | Reference Working Example 2 | Reference Working Example 3 | Reference Working Example 4 |
|---|---|---|---|---|---|---|
| substrate material layer | type of substrate | | PET | | | |
| resin layer | composition | IBXA | 75 | | | |
| | | DPHA | 15 | | | |
| | | GMA | 10 | | | |
| | transfer pattern | | column | | | |
| | pattern period | | 450 | | | |
| | pattern height (nm) | | 165 | | | |
| | film thickness (nm) | | 1000 | | | |
| | film thickness/pattern height | | 2.85 | | | |
| | cure shrinkage | | 3% | | | |
| | cure stability | | ○ | | | |
| pattern transfer conditions | pressure (MPa) | | 0.4 | 0.8 | 0.8 | 3 |
| | UV irradiation conditions | | 10 mW/cm² × 60 sec | 10 mW/cm² × 10 sec | 50 mW/cm² × 2 sec | 10 mW/cm² × 10 sec |
| pattern results | SEM | dia. (nm) | 160 | 152 | 161 | 158 |
| | | period (nm) | 458 | 462 | 458 | 458 |
| | AMF | height (nm) | 160 | 160 | 160 | 160 |

Abbreviations within the table have the below listed meanings.
IBXA: isobornyl acrylate
MMA: methyl methacrylate
POA: phenoxyethyl acrylate
LA: lauryl acrylate
A-NPG: neopentylglycol acrylate
AA: acrylic acid
4HBA: 4-hydroxybutylacrylate
DMAEA: dimethylamino ethyl acrylate
GMA: glycidyl methacrylate
PDMS: polydimethylsiloxane
DPHA: dipentaerythritol hexaacrylate
DSX: fluorine type mold release agent TABLE 4-continued

|  | Example 1 | Reference Example 1 |
|---|---|---|
| pattern defect | ○ | ○ |
| transfer count | ○ | ○ |

Based on Examples 1 to 5, when the composition includes the epoxy group-containing unsaturated compound within the range of the present invention, it is found that a resin mold for nanoimprinting is obtained that has no defects in the resin mold for nanoimprinting and no transfer defects.

Based on Comparative Examples 1 to 9, 11, and 12, when the epoxy group-containing unsaturated compound is not included in the range of the present invention, it is found that resin mold for nanoimprinting defects and/or transfer defects, or the like occur. Although compounds having high crystallinity were used in Comparative Examples 4 and 5 in place of the epoxy group-containing unsaturated compound, and although a polyfunctional compound was used in Comparative Example 6 rather than the epoxy group-containing unsaturated compound, effects such as those of the present invention were not obtained. Moreover, although compounds containing non-epoxy group functional groups were used for Comparative Examples 7 to 9, effects such as those of the present invention were not obtained.

Although Comparative Example 10 used a composition that included the epoxy group-containing unsaturated compound in the range of the present invention, because of a compound that had reactivity with the epoxy group in the composition, effects such as those of the present invention were not obtained.

Examples 10 to 13, Comparative Examples 13 to 15

Blended resins were used that were the same as above except for using IBXA in place of DPHA (i.e. a polyfunctional monomer) in Examples 1, 2, 3, and 5 and in Comparative Examples 2, 3, and 10. Thereafter, the <resin solubility> and <epoxy value> were calculated. These results are shown in Table 6.

As shown in Table 6, it was determined that there was no ring opening in epoxy group due to UV irradiation, that there was solubility in solvents, and that the amount of change of the epoxy value after UV irradiation was minute.

TABLE 6

| | | Example 10 | Example 11 | Example 12 | Example 13 | Comparative Example 13 | Comparative Example 14 | Comparative Example 15 |
|---|---|---|---|---|---|---|---|---|
| composition | IBXA | 90 | 95 | 80 | 55 | 30 | 99.5 | 90 |
| | AA | | | | | | | 5 |
| | GMA | 10 | 5 | 20 | 45 | 70 | 0.5 | 5 |
| epoxy value ($\times 10^{-2}$) | before polymerization (calc. value) | 0.7 | 0.35 | 1.41 | 3.15 | 4.9 | 0.035 | 0.35 |
| | before polymerization (measured value) | 0.68 | 0.35 | 1.41 | 3.29 | 4.95 | 0.033 | 0.34 |
| | after polymerization | 0.65 | 0.31 | 1.27 | 2.8 | a | 0.032 | a |
| resin solubility | | ○ | ○ | ○ | ○ | x | ○ | x | a: This was not measured since insoluble substances existed.

The invention claimed is:

1. A resin mold for nanoimprinting, wherein depressions and protrusions transferred from a surface of a master mold are formed on a surface of a resin layer of said resin mold;
   a mold resin of the resin layer is a copolymer of a monomer having an ethylenic double bond without epoxy group and a monomer having an epoxy group as well as an ethylenic double bond, having main chain structure formed by mutual bonding of ethylenic double bonds and having non-ring opened epoxy groups as side chains,
   wherein the mold resin includes from 1 to 50 percent by weight of constituent units derived from the epoxy group-containing monomer, based on 100 percent by weight of the total of component units forming the mold resin,
   wherein the resin layer is formed on a surface of a substrate layer; an inorganic substance layer is formed on a surface of said resin layer where the substrate layer is not formed; and a mold release agent layer is formed on a surface of said inorganic substance layer.

2. The resin mold for nanoimprinting according to claim 1, wherein the monomer having an ethylenic double bond without epoxy group is (meth)acrylate.

3. The resin mold for nanoimprinting according to claim 1, wherein thickness of said mold release agent layer is from 0.5 to 20 nm.

4. The resin mold for nanoimprinting according to claim 1, wherein thickness of said inorganic substance layer is from 0.5 to 100 nm.

5. The resin mold for nanoimprinting according to claim 1, wherein said inorganic substance layer comprises at least one type of inorganic substance selected from the group consisting of $SiO_2$, $ZrO_2$, $ZnO$, $Ta_2O_5$, $HfO_2$, ITO, FTO, and $TiO_2$.

6. The resin mold for nanoimprinting according to claim 1, wherein said mold release agent layer comprises at least one type of mold release agent selected from the group consisting of fluorine type silane coupling agents, perfluoro compounds having an amino group or carboxyl group, and perfluoroether compounds having an amino group or carboxyl group.

7. The resin mold for nanoimprinting according to claim 1, wherein said substrate layer is one type of substrate selected from the group consisting of resin, glass, silicon, sapphire, gallium nitride, carbon, and silicon carbide.

8. The resin mold for nanoimprinting according to claim 1, wherein said substrate layer is one type of resin selected from the group consisting of polyethylene terephthalates, polycarbonates, polyesters, polymethylmethacrylates, polystyrenes, cyclic polyolefins, polyimides, polysulfones, polyether sulfones, and polyethylene naphthalates.

9. The resin mold for nanoimprinting according to claim 1, wherein contact angle for pure water on said mold release agent layer surface is greater than or equal to 100 degrees.

10. The resin mold for nanoimprinting according to claim 1, wherein repeat unit period of the depressions and protrusions transferred to the surface of the resin layer is from 10 nm to 50 μm.

11. A resin mold roller comprising, comprising
    a roller, and
    said resin mold for nanoimprinting according to claim 1 wound upon said roller, wherein depressions and protrusions of said resin mold for nanoimprinting according to claim 1 are oriented outwardly from said roller.

* * * * *

UNITED STATES PATENT AND TRADEMARK OFFICE
CERTIFICATE OF CORRECTION

PATENT NO. : 9,713,900 B2
APPLICATION NO. : 13/814325
DATED : July 25, 2017
INVENTOR(S) : Hiroko Yamada et al.

Page 1 of 1

It is certified that error appears in the above-identified patent and that said Letters Patent is hereby corrected as shown below:

In the Claims

Column 30, Line 60, Claim 12 after "comprising," delete "comprising"

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*